US00RE36938E

United States Patent [19]

Chan et al.

[11] E Patent Number: Re. 36,938

[45] Reissued Date of Patent: Oct. 31, 2000

[54] METHOD OF FORMING A LANDING PAD STRUCTURE IN AN INTEGRATED CIRCUIT

[75] Inventors: Tsiu C. Chan, Carrollton; Frank R. Bryant, Denton; Loi N. Nguyen, Carrollton, all of Tex.

[73] Assignee: STMicroelectronics, Inc., Carrollton, Tex.

[21] Appl. No.: 09/134,727

[22] Filed: Aug. 17, 1998

Related U.S. Patent Documents

Reissue of:

[64] Patent No.: 5,720,979
Issued: Dec. 30, 1997
Appl. No.: 08/361,760
Filed: Dec. 22, 1994

[51] Int. Cl.[7] ..... H01L 21/44

[52] U.S. Cl. ..... 438/612; 438/614; 438/629

[58] Field of Search ..... 438/612, 614, 438/629, 672, 657, 645, 639, 647

[56] References Cited

U.S. PATENT DOCUMENTS

| | | | |
|---|---|---|---|
| 4,441,247 | 4/1984 | Gargini et al. | 29/571 |
| 4,707,457 | 11/1987 | Erb . | |

(List continued on next page.)

FOREIGN PATENT DOCUMENTS

| | | | |
|---|---|---|---|
| 0 369 336 A3 | 5/1990 | European Pat. Off. | H01L 21/90 |
| 0 380 327 A3 | 8/1990 | European Pat. Off. | H01L 23/522 |
| 0 499 433 A2 | 8/1992 | European Pat. Off. | H01L 21/90 |
| 0 503 904 A2 | 9/1992 | European Pat. Off. | H01L 21/90 |
| 0 566 253 A1 | 10/1993 | European Pat. Off. | H01L 23/485 |
| 62-136 856 | 6/1987 | Japan . | |
| 62-272555 | 11/1987 | Japan . | |
| 1-304807 | 8/1989 | Japan . | |
| 1-225337 | 9/1989 | Japan | H01L 21/88 |
| 3016220 | 1/1991 | Japan | H01L 21/3205 |
| 3073531 | 3/1991 | Japan | H01L 21/3205 |
| 4-307732 | 10/1992 | Japan . | |

OTHER PUBLICATIONS

Broadbent, et al., "Selective Low Pressure Chemical Vapor Deposition of Tungsten" J. Electrochem. Soc.: Solid–State Science and Technology, vol. 131, No. 6 pp. 1427–1433, Jun. 1984.

G. Queirolo, et al. "Dopant Activation, Carrier Mobility, and TEM Studies in Polycrystalline Silicon Films", J. Electrochem. Soc. V. 137, No. 3, pp. 967–970, Mar. 1990.

C.S. Pai, et al. "Chemical Vapor Deposition of Selective Epitaxial Silicon Layers", J. Electrochem. Soc., V.137, No. 3, pp. 971–976, Mar. 1990.

M. Cleeves, et al. "A Novel Disposable Post Technology for Self–Aligned Sub–micron Contacts" IEEE Symposium on VLSI Technology Digest of Tech. Papers, pp61–62, 1994.

*Primary Examiner*—Caridad Everhart
*Attorney, Agent, or Firm*—Theodore E. Galanthay; Lisa K. Jorgenson; Dan Venglarik

[57] ABSTRACT

A method is provided for forming an improved landing pad of a semiconductor integrated circuit, and an integrated circuit formed according to the same. A first opening is formed through a first dielectric layer to expose a portion of a diffused region. A first polysilicon landing pad is formed over the first dielectric layer and in the opening. This landing pad will provide for smaller geometries and meet stringent design rules such as that for contact space to gate. A dielectric pocket is formed over the polysilicon landing pad over the active region. A second conductive landing pad is formed over the polysilicon landing pad and the dielectric pocket. A second dielectric layer is formed over the landing pad having a second opening therethrough exposing a portion of the landing pad. A conductive contact, such as aluminum, is formed in the second contact opening. The conductive contact will electrically connect with the diffused region through the landing pad. Misalignment of the conductive contact opening over the landing pad may be tolerated without invading design rules. The landing pad and the dielectric pocket will enhance planarization to provide for better step coverage of the metal contact in the second opening.

35 Claims, 3 Drawing Sheets

U.S. PATENT DOCUMENTS

| | | | |
|---|---|---|---|
| 4,782,380 | 11/1988 | Shankar et al. | 357/71 |
| 4,789,885 | 12/1988 | Brighton et al. . | |
| 4,795,718 | 1/1989 | Beitman | 438/621 |
| 4,795,722 | 1/1989 | Welch et al. | 438/621 |
| 4,810,666 | 3/1989 | Taji . | |
| 4,822,749 | 4/1989 | Flanner et al. . | |
| 4,844,776 | 7/1989 | Lee et al. . | |
| 4,851,895 | 7/1989 | Green et al. | 357/67 |
| 4,868,138 | 9/1989 | Chan et al. . | |
| 4,884,123 | 11/1989 | Dixit et al. | 357/71 |
| 4,908,332 | 3/1990 | Wu . | |
| 4,916,397 | 4/1990 | Masuda et al. . | |
| 4,922,311 | 5/1990 | Lee et al. . | |
| 4,984,056 | 1/1991 | Fujimoto et al. . | |
| 4,994,410 | 2/1991 | Sun et al. | 438/649 |
| 4,997,790 | 3/1991 | Woo et al. . | |
| 5,036,378 | 7/1991 | Lu et al. | 357/23.5 |
| 5,036,383 | 7/1991 | Mori . | |
| 5,071,783 | 12/1991 | Taguchi et al. . | |
| 5,081,516 | 1/1992 | Haskell | 357/42 |
| 5,110,752 | 5/1992 | Lu . | |
| 5,158,910 | 10/1992 | Cooper et al. . | |
| 5,192,715 | 3/1993 | Sliwa, Jr. et al. | 438/631 |
| 5,198,683 | 3/1993 | Sivan | 257/67 |
| 5,210,429 | 5/1993 | Adan . | |
| 5,214,305 | 5/1993 | Huang et al. | 257/413 |
| 5,219,789 | 6/1993 | Adan . | |
| 5,229,326 | 7/1993 | Dennison et al. . | |
| 5,236,867 | 8/1993 | Furuta et al. | 438/305 |
| 5,275,963 | 1/1994 | Cederbaum et al. | 438/624 |
| 5,275,972 | 1/1994 | Ogawa et al. . | |
| 5,293,053 | 3/1994 | Malhi et al. | 257/330 |
| 5,296,729 | 3/1994 | Yamanaka et al. | 257/377 |
| 5,298,463 | 3/1994 | Sandhu et al. . | |
| 5,308,795 | 5/1994 | Hawley et al. . | |
| 5,315,141 | 5/1994 | Kim | 257/308 |
| 5,316,976 | 5/1994 | Bourg, Jr. et al. . | |
| 5,334,862 | 8/1994 | Manning et al. | 257/67 |
| 5,359,226 | 10/1994 | DeJong | 257/773 |
| 5,414,302 | 5/1995 | Shin et al. | 257/752 |
| 5,420,058 | 5/1995 | Lee et al. . | |
| 5,448,091 | 9/1995 | Bryant et al. | 257/315 |
| 5,514,622 | 5/1996 | Bornstein et al. . | |
| 5,541,137 | 7/1996 | Manning et al. | 438/624 |
| 5,581,093 | 12/1996 | Sakamoto | 257/67 |
| 5,596,212 | 1/1997 | Kuriyama | 257/298 |
| 5,604,382 | 2/1997 | Koyama | 257/774 |
| 5,616,934 | 4/1997 | Dennison et al. | 257/67 |
| 5,633,196 | 5/1997 | Zamanian | 438/653 |

METHOD OF FORMING A LANDING PAD STRUCTURE IN AN INTEGRATED CIRCUIT

Matter enclosed in heavy brackets [ ] appears in the original patent but forms no part of this reissue specification; matter printed in italics indicates the additions made by reissue.

This application is [a continuation-in-part application] *related to the subject matter* of U.S. patent application Ser. No. 08/251,025, [U.S. Pat. No. 5,633,196 (Attorney Docket No. 94-C-014),] filed May 31, 1994, [both of the applications] *, now U.S. Pat. No. 5,633,196,* assigned to SGS-Thomson Microelectronics, Inc. and incorporated herein by reference.

FIELD OF THE INVENTION

The present invention relates generally to semiconductor integrated circuit processing, and more specifically to an improved method of forming a landing pad structure under a metal contact.

BACKGROUND OF THE INVENTION

Design rules are required in integrated circuit design which allow for variations in the fabrication processes to protect against catastrophic failures and to guarantee the electrical parameters of the devices: the electrical parameters being related to by the physical dimensions of the features. Certain feature sizes and minimum space or design tolerance must be maintained between devices in order to maintain the electrical integrity of the devices. Shapes and sizes may vary as a result of, for example, mask misalignment or variations in photoresist exposure. Design rules have thus been established for the various types of material used and the particular location devices on the chip, for example, width and spacing rules exist for metal, diffusion and polysilicon materials as well as for contact openings such as a metal contact space to gate. Any misalignment is the formation of a metal contact, for example to a diffused region, may invade the required space between the contact and a surrounding device such as the polysilicon gate. Thus, reduction in the minimum required spacing will not meet the design tolerance and will not insure the devices' electrical characteristics.

To avoid the problems caused by a metal contact when misalignment or other spacing problems occur between, for example, the metal contact and gate, a landing pad may be formed between the metal contact and an underlying diffused region. The landing pad may be formed from a polysilicon layer over which a silicide layer may be formed to decrease sheet resistance. Due to the design rules for polysilicon, the landing pad will allow for a reduction in the size of the cell and tolerate greater misalignment problems. The landing pad, however, creates a topography problem for subsequently formed layers. Depending on the actual layout, the contact opening formed over the landing pad may have a higher aspect ratio, the height of the contact opening divided by the width of the opening, than an opening formed without a landing pad. The larger the aspect ratio, the more difficult it will be to fill a contact opening.

An additional problem in the field of integrated circuit manufacture, particularly with the continuing trend toward smaller integrated circuit feature sizes, is the making of high-reliability conductive electrical contacts between metallization layers and of high-reliability conductive electrical contacts between metallization layers and semiconductor elements, particularly contacts between aluminum and diffused junctions into single-crystal silicon. This increased difficulty is due to the tendency for aluminum and silicon to interdiffuse when in contact with one another, and when subjected to the high temperatures necessary for integrated circuit manufacturing. As is well known in the art, conventional integrated circuit process steps can cause silicon from the substrate to diffuse rather rapidly into pure aluminum in an attempt to satisfy the solubility of silicon in aluminum. The silicon exiting the substrate is then replaced by the newly formed aluminum+silicon alloy. The diffusion back into the substrate of the aluminum+silicon alloy may diffuse to such a depth as to short out a shallow p-n junction in the silicon. This phenomenon is known as junction spiking. The use of silicon-doped aluminum in forming integrated circuit metallization, while preventing junction spiking, is known to introduce the vulnerability of the contact junction to the formation of silicon nodules thereat, such nodules effectively reducing the contact area, and thus significantly reducing the conductivity of the contact.

Accordingly, recent advances in the field of integrated circuit fabrication have been made by the introduction of so-called "barrier" layers at the aluminum-silicon interface. Conventionally, the barrier layer is a refractory metal material such as titanium-tungsten (TiW), or a refractory metal nitride such as titanium nitride (TIN). The barrier layer is formed at the contact location so as to be disposed between the silicon and the overlying aluminum layer. In some cases, the barrier layer is formed by deposition of the refractory metal, followed by an anneal which forms both the barrier layer and also a metal silicide where the metal is in contact with the silicon; as is known in the art, the metal silicide improves the conductivity of the contact. In any case, the barrier layer inhibits the interdiffusion of aluminum and silicon atoms, thus eliminating the problems of junction spiking and silicon nodule formation noted above.

While a barrier layer eliminates the problems associated with aluminum in direct contact with silicon, it is difficult to form a uniform barrier in contact openings that have a large aspect ratio such as that in contact with a landing pad. Even with today's deposition technology including chemical vapor deposition (CVD) and collimated sputtering, it is often hard to uniformly coat all sides in an opening, particularly in the corners of the openings. If the barrier layer is not thick enough, pin holes may result from inadequate coverage, resulting in the junction spiking problem noted above, to occur.

It is therefore an object of the present invention to provide a method of forming an integrated circuit with a landing pad in such a manner as to reduce the aspect ratio of the metal contact opening.

It is a further object of the present invention to provide such a method that provides more planarization for subsequent processing steps which will improve step coverage of subsequently formed barrier layers and metal contacts.

It is a yet further object of the present invention to provide such a method that tolerates misalignment of contact openings over the landing pad.

It is a further object of the present invention to provide such a method that utilizes standard processes.

Other objects and advantages of the present method will be apparent to those of ordinary skill in the art having reference to the following specification together with the drawings.

SUMMARY OF THE INVENTION

The invention may be incorporated into a method for forming a semiconductor device structure, and the semiconductor device structure formed thereby. An active or diffused region is formed on a substrate. A first dielectric layer having a first opening therethrough is formed over the active region. A first polysilicon landing pad is formed over the first dielectric and in the first opening. A dielectric pocket is formed over the polysilicon landing pad and the dielectric pocket. The dielectric pocket enhances planarization of the conductive portion of the landing pad. The conductive landing pad preferably comprises a refractory metal silicide to reduce the resistance of the landing pad. A second dielectric layer is formed over the landing pad with an opening therethrough to expose a portion of the landing pad. A metal contact can be made in the second opening of the active region through the landing pad. This second opening preferably has a smaller aspect ratio than the first opening to facilitate better step coverage of barrier layers and metal contacts in the opening.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

FIGS. 1–2A and 3–4 are cross-sectional views of the fabrication of a semiconductor integrated circuit according to one embodiment of the present invention.

DETAILED DESCRIPTION OF THE PREFERRED EMBODIMENTS

Referring now to FIGS. 1–5, a method of fabricating an integrated circuit to have a landing pad according to the present invention will now be described in detail. The cross-sections of FIGS. 1–5 illustrate this method as a portion of an overall process flow for fabricating the integrated circuit. As will be apparent to those of ordinary skill in the art, the partial process flow to be described herein may be applied in the fabrication of many types of integrated circuits, in which the full process flow will include many other process steps conventional in the art.

Figure 1:
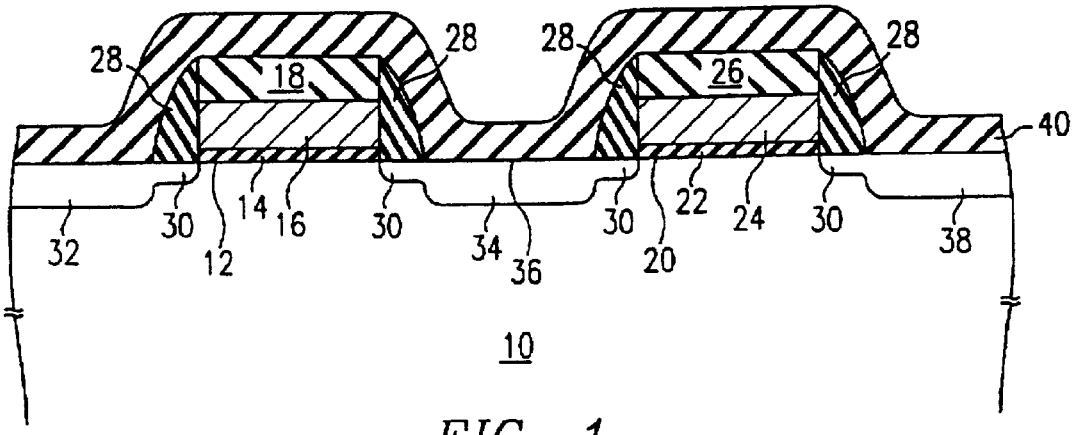

FIG. 1 illustrates, in cross-section, a portion of an integrated circuit that has been partially fabricated. According to the example described herein, the present invention is directed to forming a landing pad between a metallization layer such as aluminum and an active region such as a doped semiconductor region in single-crystal silicon, as such contacts are generally the most sensitive to the misalignment and design rules for spacing addressed by the landing pad and the spiking and nodule problems addressed by the barrier layer. It is contemplated, of course, that the present invention will also be applicable to the formation of other contacts, including, for example, contacts between metallization and polysilicon.

The structure of FIG. 1, includes silicon substrate 10. Various active devices may be formed on or in the surface of the substrate as well as overlying any field oxide regions which may be formed to separate devices. In a particular application, substrate transistors 12 and 20 are shown having gate oxide layers 14 and 22, and gate electrodes 16 and 24 overlying the gate oxide layers and typically formed from a first layer of polysilicon. As is known in the art, typically gate electrodes 16, 24 will have sidewall spacers 28, lightly doped drain regions 30 and source and drain or diffused regions 32, 34 shown for transistor 12 and diffused regions 34, 38 shown for transistor 20. Diffused or active region 34 may form a shared contact 36 between devices as is known in the art. In the preferred embodiment, diffused region 34 forms the source of one transistor and the drain of the adjacent transistor.

The diffused or active region 34 is formed of opposite conductivity type from that of substrate 10. For example, substrate 10 may be lightly doped p-type silicon and diffusion region 34 may be heavily doped n-type silicon. Of course, as noted above, other structures (with the same or opposite conductivity type selection) may alternatively be used; for example, substrate 10 may instead be a well or tub region in a CMOS process, into which diffusion or active region 34 is formed. In the example of FIG. 1, diffusion 34 is bounded by both substrate transistors 12, 20. In this example, diffusion 34 is very shallow, such as on the order of 0.15 microns, as is conventional for modern integrated circuits having sub-micron feature sizes. As such, diffusion 34 may be formed by ion implantation of the dopant followed by a high-temperature anneal to form the junction, as is well known in the art. Alternatively, the ion implantation may be performed prior to the formation of subsequent layers, with the drive-in anneal performed later in the process, if desired.

In the preferred embodiment, transistors 12, 20 may also have a capping layer 18, 26, respectively. The capping layer may be formed directly over the polysilicon gate electrodes 16, 24 or over a polycide. The capping layer is preferably an oxide or nitride formed to encapsulate the gate electrode as more fully describe in U.S. patent application Ser. No. 08/331691 filed on Oct. 31, 1994 and incorporated herein by reference. The capping layer is preferably formed to a depth of between approximately 500 to 2000 angstroms over the polysilicon before the polysilicon is patterned and etched to form the gate electrodes. The capping layer may then be patterned and etched with the polysilicon to cap only the polysilicon remaining which forms the gate electrodes. The sidewall spacers may then be formed after the capping layer is formed to further encapsulate the gate electrodes and increase the tolerance for design rules and provide sufficient distance between the gate electrodes and subsequently formed conductive regions adjacent to the transistor gates.

Dielectric layer 40, which may be a deposited oxide or another suitable dielectric layer, is formed over diffusion region 34 and other already formed devices such as transistors 12, 20. Dielectric layer 40, formed for purposes of electrically isolating overlying conductive structures from diffusion 34 and other devices except at locations where contacts are desired therebetween, may have a thickness of between approximately 500 to 2000 angstroms.

Figure 2A:
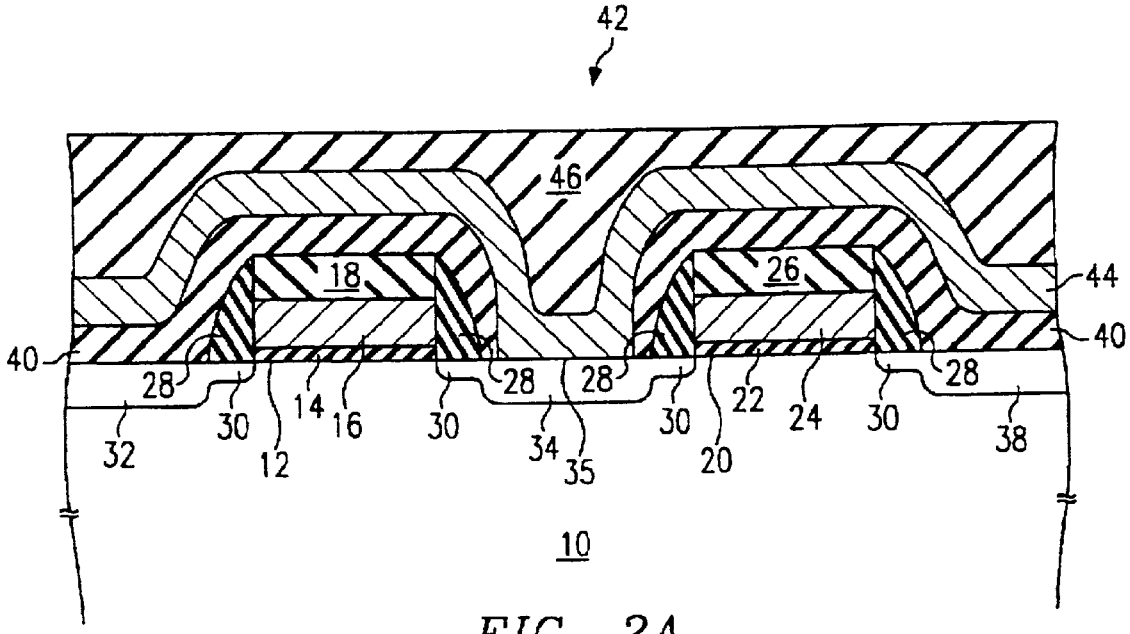
Figure 2B:
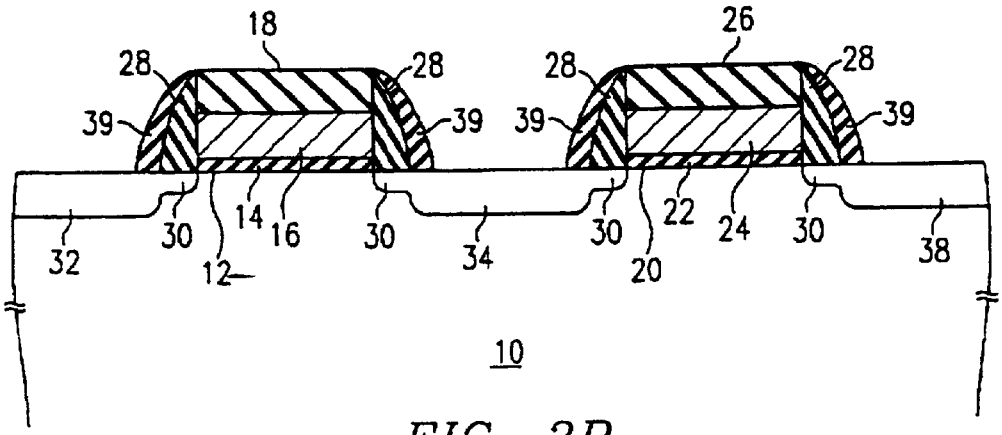
FIGS. 2B and 5 are cross-sectional views of the fabrication of a semiconductor integrated circuit according to an alternative embodiment of the present invention.

As shown in FIG. 2A, contact opening 42 is formed through dielectric layer 40, for example, by way of reactive ion etching or another type of anisotropic etching; as will be apparent below, this embodiment of the invention is concerned with the formation of an overlying landing pad that is in contact with diffusion region 34 and under an overlying metallization layer subsequently formed. Dielectric layer 40 is masked in order to etch primarily only opening 42 through layer 40. If dielectric layer 40 is etched without being masked, the upper surface of the layer is vertically etched essentially at the same rate as the opening. In this case, a second sidewall oxide spacer 39, as shown in FIG. 2B, is formed along the sides of sidewall spacers 28. These second sidewall spacers 39 will provide for a self-aligned contact to be made to the active or diffused region 34 and will increase the distance between the edge of the polysilicon gate 16, 24 and the edge of the contact opening 42. However, the distance from the top of the polysilicon gate 16, 24 to an overlying conductive layer will depend on the thickness of the capping layer 18, 26.

With reference to FIG. 2A, misalignment of the contact opening 42 over the diffused region 34, such as opening over the sidewall spacers, may decrease the contact space between the edge of gate electrodes 12, 20 and the side of the contact opening 42. Due to any misalignment of the contact opening, effectively opening over the sidewall spacers 28 or 39 of either transistor 12, 20, the distance between these active areas may be reduced enough such that the design rules for a metal contact space to gate are not met and device yield may thus decrease. In addition, misalignment of the contact opening 42 increases the aspect ratio of the opening, increasing step coverage problems for metal contacts. To prevent any misalignment of the opening 42 from removing the sidewall spacers, these sidewall spacers 28 may be formed of nitride. In the preferred embodiment, a material is formed in contact opening 42 whereby the design rules for contact space or side of contact 42 to edge of gates 12, 20 are met while enhancing the planarization of the surface topography to allow barrier layers and metal contacts to be uniformly formed.

With reference to FIGS. 2A–4, the present invention will be further described following from FIG. 2A. It will be appreciated, however, from those skilled in the art that this invention may be practiced with the second sidewall spacer as shown in FIG. 2B. Referring now to FIG. 2A, a polysilicon layer 44 is formed over dielectric layer 40 and in the contact opening 42 in contact with the diffused region 34. Polysilicon layer 44 is preferably about 1000 to 2000 angstroms thick and is deposited as an insitu doped polysilicon being doped with a similar dopant as the diffused region 34, such as by ion implantation or other suitable method. In this example, if the diffused region 34 is $N^+$, the polysilicon layer 44 may be $N^+$ insitu doped polysilicon as deposited with sufficient doping level to reduce the contact resistance of this layer and provide an adequate electrical path to the diffused region 34. In this example, the doping level is approximately $10^{20}$ ions/$cm^3$ as formed. In order to provide a relatively thin polysilicon layer 44 which will enhance planarization, yet provide an adequate electrical connection to the active region 34, the conformal polysilicon does not fill contact opening 42. A dielectric layer 46 is formed over the polysilicon layer 44, preferably a spin-on-glass or other suitable planarizing material.

Figure 3:
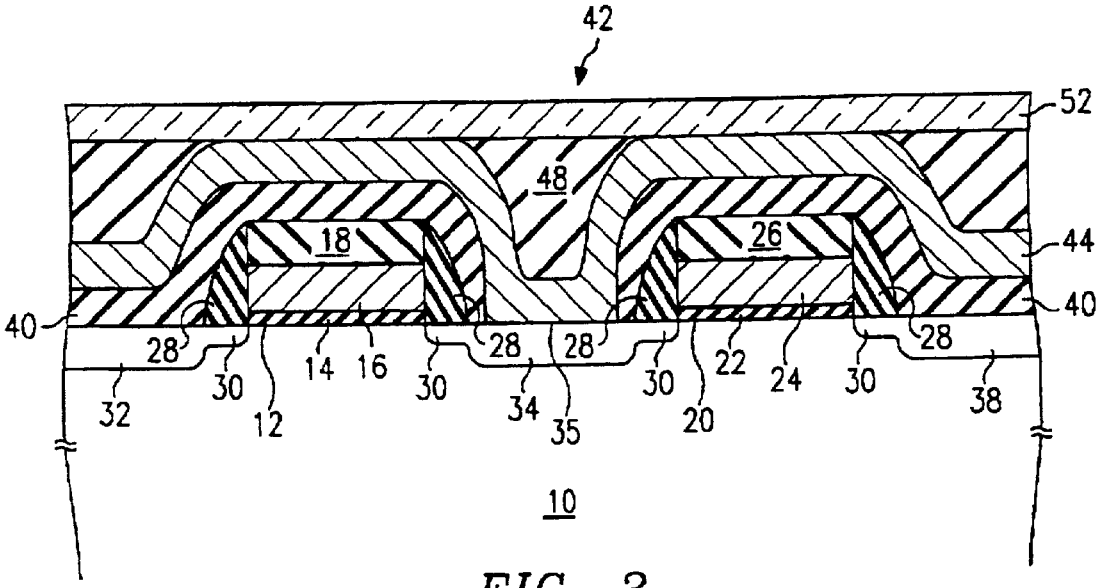

Referring to FIG. 3, the dielectric layer is etched back to expose the upper portion of the polysilicon layer not in the opening 42. The etch back will form pockets of dielectric material 48 in areas lower than the upper surface of the polysilicon. The dielectric layer will increase the planarization of the wafer at this stage of manufacturing and is easy to form in the pockets.

A conductive layer 52 is formed to a preferred thickness of about 500 to 2000 angstroms and over the dielectric pocket 48. Since the dielectric pocket will increase the resistance of the contact to active area in opening 42, the conductive layer 48 is preferably a refractory metal silicide, for example, tantalum disilicide ($TaSi_2$) or other suitable refractory metal or refractory metal silicide which will help to reduce the resistance of the polysilicon layer 44 where the conductive layer 52 crosses over the polysilicon layer 44. Alternatively, conductive layer 52 may be a doped polysilicon layer with a sufficient doping level to reduce the contact resistance and provide an adequate electrical path to the active region 34 through the polysilicon layer 44. If layer 52 is doped polysilicon layer, it may be insitu doped or may be doped after it is formed over the polysilicon layer 44 by any suitable method such as implantation.

Figure 4:
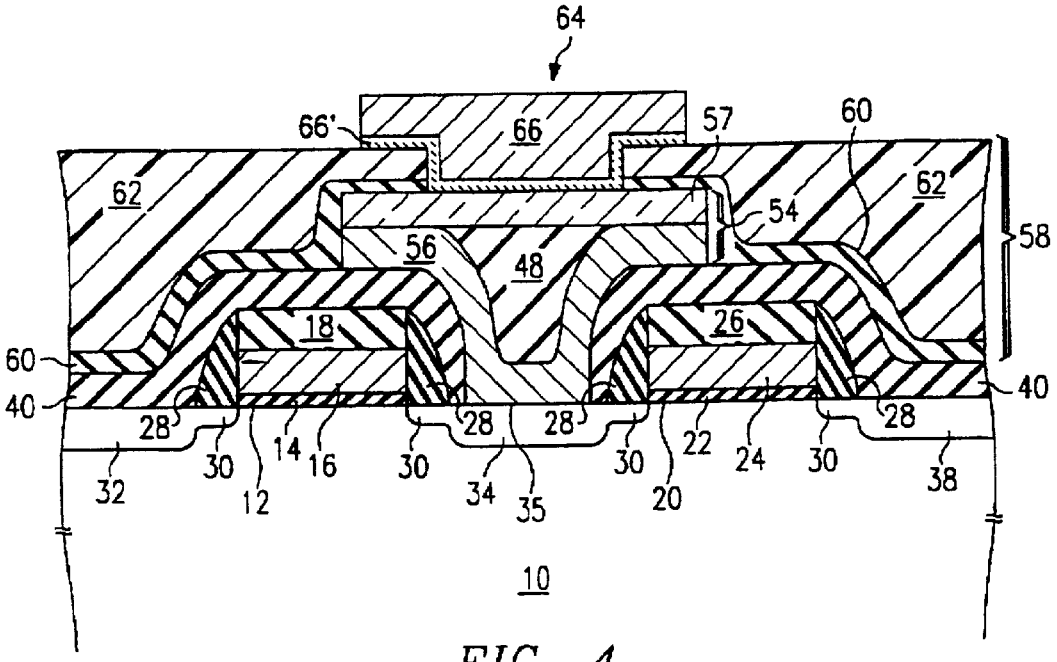

Referring to FIG. 4, polysilicon layer 44 and conductive layer 52 are patterned and etched to form a conductive landing pad 54, which in this example is a bilayer formed from a conductive layer 57 over a polysilcion layer 56. The conductive layer 57 is substantially planar over the lower polysilicon landing pad due to the dielectric pocket 48 in the opening and over the polysilicon layer 56. The landing pad 54 extends into the opening to the diffused region 34 and over a portion of the dielectric layer 40 adjacent the opening. Landing pad 54 will provide for proper design rules for spacing such as that between the contact edge in opening 42, and the transistor gate edge of gates 12, 20 caused by such factors as smaller required geometries and misalignment of the contact openings over the active region 34.

A second dielectric layer 58 is formed over the landing pad 54 and first dielectric layer 40. The second dielectric layer 58 may be, for example, a multi-layer film or a glass layer such as spin-on-glass or borophosphorus silicate glass (BPSG) again to aid in planarization of the surface of the wafer at this stage of processing. An example of a multi-layer film may be undoped oxide 60 formed under a BPSG layer 62. The undoped oxide may aid in protecting areas of the chip during subsequent processing steps and in particular will help to prevent the BPSG layer from forming directly on active areas which may not be covered by the first dielectric layer 40. The dielectric layer 58 will have a thickness dependent upon the underlying topography and may be between approximately 3000 to 12000 angstroms. An opening 64 is formed through the dielectric layer 58 exposing a portion of the landing pad 54. If BPSG is used for the second dielectric layer 58, as is known in the art, it will typically be reflowed to round the corners at the opening 64.

A conductive layer is formed over the dielectric layer 58 and in opening 64, patterned and etched to form a conductive contact 66. Contact 66 may be an aluminum alloy or a composite barrier layer underlying an aluminum alloy, as is known in the art. A barrier layer formed under the metal contact may be necessary to reduce the well known wear out failure mechanism referred to as stress induced migration and electromigration. A thin barrier layer 66' of a refractory metal or refractory metal nitride may be deposited in the opening 64 and over the second dielectric layer 58 by way of sputtering or other suitable method, to a thickness of about 400 to 1000 anstroms. As is known in the art, barrier layer 66' is preferably formed of titanium nitride or other suitable refractory metal nitride, or may be formed of titanium, titanium-tungsten, or other suitable refractory metal. The barrier layer may alternatively be formed of refractory metal nitride over a refractory metal, for example, a titanium nitride may be formed over a titanium layer. The material and thickness of barrier layer 66' are selected to optimize process conditions to prevent diffusion of atoms between an overlying conductive layer and the underlying landing pad 54.

A contact 66 makes electrical connection to diffused region 34, in this example, through landing pad 54, comprising a polysilicon layer 56 underlying a conductive layer 57. Any misalignment of the width and location of the contact opening 64 over the landing pad 54 is not as critical as the previous contact opening 42 to diffused region 34. With the landing pad 54 formed between the contact 66 and the active region 34, the design rules for contact to gate spacing are maintained. A wider and/or more shallow contact opening 64 over the landing pad 54 may thus be formed to facilitate the deposition of a contact metal such as aluminum or other suitable contact metal with a barrier layer under the contact metal. The barrier layer will be able to form more uniformly along the sides and bottom of the contact opening and more particularly in the corners. In addition, some misalignment of contact opening 64 over the landing pad 54 will be tolerated without invalidating design rules, such misalignment of the contact opening 64 for a metal contact not being tolerated at the diffused region 34, in this example between transistors 12, 20.

A composite polysilicon/conductive layer landing pad, formed preferably from a refractory metal silicide overlying a portion of a doped polysilicon layer has the advantage of enhancing planarization and improving the barrier and metal contact step coverage by reducing the aspect ratio in a metal contact. Planarization is further enhanced with the dielectric in the opening over the polysilicon layer to substantially increase the planarization of the upper conductive layer of the landing pad. The polysilicon and conductive layer may be formed in various ways to more easily adapt to modern manufacturing techniques. Additionally, nitride spacers may be used for the substrate transistors to self-align the contact opening for the polysilicon to active area contact and to thereby decrease the overall cell area without invading required design rules.

Figure 5:
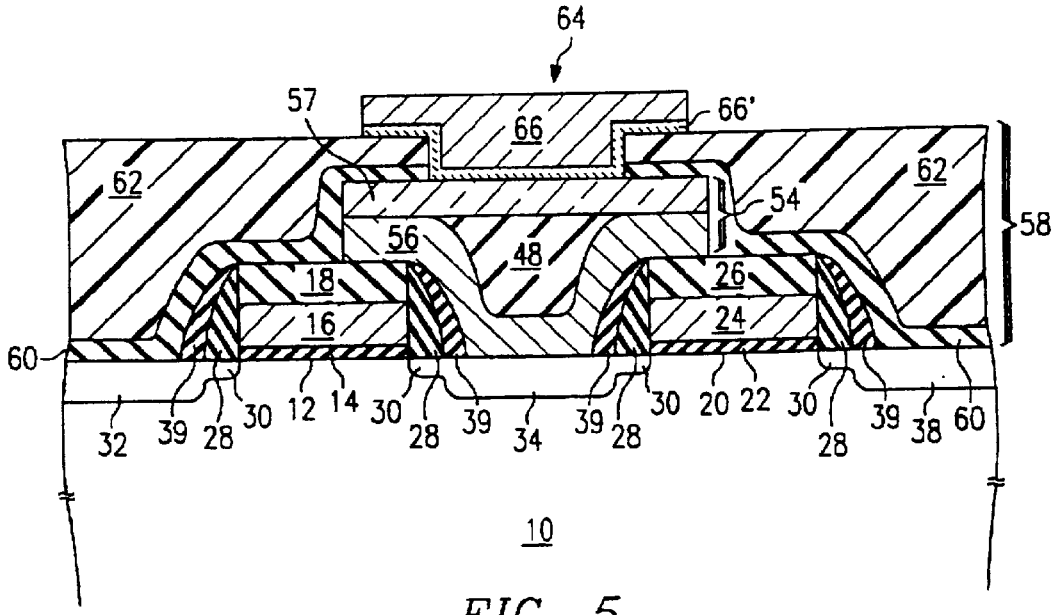

Referring to FIG. 5, an alternative for forming a self-aligned contact is shown. If layer 40 is unmasked when etched to form opening 42, as described above with reference to FIG. 2B, sidewall oxide spacers 39 are formed along the sides of sidewall spacers 28. Where the polysilicon layer 56 is formed over the sidewall spacers 39 and the capping layers 18, 26, the aspect ratio of opening 42 will be smaller and will make it easier to form the polysilicon in opening 42. Even with the capping layer 18, 26 directly under the polysilicon layer 56 of the landing pad 54, the design rules should be maintained for the polysilicon landing pad. Without the additional height over the capping layer 18, 26, this method provides additional planarization for subsequently formed layers. It may be important, however, to leave some oxide over substrate areas so that the polysilicon layer does not directly contact the substrate. If this situation occurs, there may be an undesired result of etching the silicon substrate along with the polysilicon.

While the invention has been described herein relative to its preferred embodiments, it is of course contemplated that modifications of, and alternatives to, these embodiments, such as modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of forming a portion of a semiconductor integrated circuit; comprising the steps of:

forming an active region on a substrate;

forming a first dielectric layer having a first opening therethrough exposing a portion of the active region;

forming a first conductive layer in the first opening and on a portion of the first dielectric layer adjacent the first opening;

forming a dielectric pocket over a portion of the first conductive layer overlying the active region;

forming a second conductive layer over the first conductive layer and the dielectric pocket; and etching the first and the second conductive layers to form a landing pad in the first opening and over a portion of the first dielectric layer comprising the first and second conductive layers and the dielectric pocket.

2. The method of claim 1, wherein the dielectric layer comprises an undoped oxide region adjacent the first opening.

3. The method of claim 2, wherein the undoped oxide comprises an oxide overlying a device structure adjacent the active region.

4. The method of claim 2, wherein the undoped oxide comprises a capping layer overlying a transistor adjacent the active region and a plurality of sidewall spacers along the side of the transistor adjacent the first opening.

5. The method of claim 1, wherein the active region is a shared contact in an upper portion of the substrate.

6. The method of claim 1, wherein the first conductive layer comprises a doped polysilicon.

7. The method of claim 6, wherein the first conductive layer has a thickness of between approximately 1000 to 2000 angstroms.

8. The method of claim 1, wherein the second conductive layer comprises a refractory metal silicide.

9. The method of claim 8, wherein the refractory metal silicide comprises tantalum oxide.

10. The method of claim 1, wherein the second conductive layer comprises a doped polysilicon.

11. The method of claim 1, wherein the second conductive layer has a thickness of between approximately 500 to 2000 angstroms.

12. The method of claim 1, wherein the dielectric pocket comprises spin-on-glass.

13. The method of claim 1, further comprising the steps of:

forming a second dielectric layer over a portion of the second conductive layer and the first dielectric layer.

14. The method of claim 13, wherein the second dielectric layer comprises BPSG.

15. The method of claim 13, wherein the second dielectric layer comprises an undoped oxide layer underlying a BPSG layer.

16. The method of claim 11, wherein the second dielectric layer has a thickness of about 3000 to 12000 angstroms.

17. The method of claim 13, further comprising the step of:

forming a conductive contact over the exposed portion of the second conductive layer.

18. The method of claim 17, wherein the conductive contact comprises an aluminum alloy.

19. The method of claim 17, wherein the conductive contact comprises an aluminum alloy/barrier bilayer.

20. A method of forming a portion of a semiconductor integrated circuit; comprising the steps of:

forming a plurality of devices over a portion of a substrate;

forming an active region on a substrate between at least two devices;

forming a first dielectric layer over the devices and the active region;

etching the first dielectric layer to form a first opening exposing a portion of the active region;

forming a doped polysilicon layer over the exposed portion of the active region in the opening and the first dielectric layer;

forming a spin-on-glass layer over the first doped polysilicon layer;

performing an etch back of the spin-on-glass to expose an upper portion of the doped polysilicon layer;

forming a conductive layer over the doped polysilicon layer and the remaining spin-on-glass layer; and patterning and etching the conductive and doped polysilicon layers to form a landing pad; the polysilicon layer portion of the landing pad remaining in the opening and over a portion of the first dielectric layer and the conductive layer portion of the landing pad remaining over a portion of the polysilicon layer and over the spin-on-glass.

21. The method of claim 20, further comprising the steps of:

forming a second dielectric layer over the landing pad and the first dielectric layer; and patterning and etching the second dielectric layer to form a second opening exposing a portion of the landing pad.

22. The method of claim 20, further comprising the steps of:

forming a second dielectric layer over the landing pad and the first dielectric layer; and patterning and etching the second dielectric to form a second opening exposing a portion of the landing pad.

23. The method of claim 21, wherein the aspect ratio of the second opening is less than the aspect ratio of the first opening.

24. The method of claim 22, further comprising the step of:

forming a metal contact in the second opening over the landing pad.

25. The method of claim 21, wherein the devices comprise transistors, each transistors having a gate opxide, a gate electrode and sidewall spacers.

26. The method of claim 24, wherein the transistors further comprise a capping layer over the gate electrode.

27. The method of claim 25, wherein the capping layer comprises an oxide.

28. The method of claim 24, wherein the transistor spacers comprise oxide.

29. The method of claim 24, wherein the transistors spacers comprise nitride.

30. The method of claim 20, wherein the first dielectric layer comprises an undoped oxide region adjacent the first opening.

31. The method of claim 29, wherein the undoped oxide comprises an oxide layer overlying a device structure adjacent the active region.

32. The method of claim 30, wherein the first dielectric layer has a thickness of between approximately 500–2000 angstroms.

33. The method of claim 29, wherein the undoped oxide comprises a capping layer overlying a transistor adjacent the active region and a plurality of sidewall spacers along the side of the transistor adjacent the first opening.

34. The method of claim 20, wherein the second dielectric layer comprises a BPSG layer.

35. The method of claim 20, wherein the second dielectric layer comprises an undoped oxide underlying a BPSG layer.

* * * * *